United States Patent [19]

Fruhauf et al.

[11] Patent Number: 5,144,515
[45] Date of Patent: Sep. 1, 1992

[54] DETECTOR OF FAST VARIATION IN THE SUPPLY OF INTEGRATED CIRCUITS

[75] Inventors: Serge Fruhauf, Peynier; Fré éric Breugnot, Gournay Sur Marne, both of France

[73] Assignee: SCS-Thomson Microelectronics S.A., Gendelly, France

[21] Appl. No.: 624,336

[22] Filed: Dec. 7, 1990

[30] Foreign Application Priority Data

Dec. 8, 1989 [FR] France .............. 89 16296

[51] Int. Cl.$^5$ ............................. H02H 9/00
[52] U.S. Cl. .............................. 361/18; 361/56; 361/91
[58] Field of Search ............ 361/18, 56, 90, 91, 361/92, 111

[56] References Cited

U.S. PATENT DOCUMENTS

| | | | |
|---|---|---|---|
| 4,173,756 | 11/1979 | Kawagai et al. | 340/636 |
| 4,551,779 | 11/1985 | Murakami | 361/86 |
| 4,706,157 | 11/1987 | Shimazu | 361/86 |
| 4,717,840 | 1/1988 | Ouyang et al. | 307/594 |
| 4,835,423 | 5/1989 | de Ferron et al. | 307/584 |
| 4,860,258 | 8/1989 | Fruhauf et al. | 365/194 |
| 4,924,212 | 5/1990 | Fruhauf et al. | 340/598 |
| 4,932,053 | 6/1990 | Fruhauf et al. | 380/4 |
| 5,018,041 | 5/1991 | Szepesi | 361/18 |

FOREIGN PATENT DOCUMENTS

| | | |
|---|---|---|
| 0270410 | 8/1988 | European Pat. Off. . |
| 2587531 | 3/1987 | France . |
| 2605765 | 4/1988 | France . |
| 2449898 | 9/1990 | France . |
| 2600795 | 11/1990 | France . |
| 57-175261 | 10/1982 | Japan . |
| 9104473 | 4/1991 | World Int. Prop. O. . |

Primary Examiner—Steven L. Stephan
Assistant Examiner—Adolf Berhane

[57] ABSTRACT

Some integrated circuits need to be protected against malfunctioning due to the variations in the supply voltage Vcc. A detector of fast variations of the supply voltage is placed in the integrated circuit to interrupt or modify all or a part of the working of the general integrated circuit in the event of the occurrence of fast variation in Vcc. The detector includes a capacitor, a current limiter, a charging circuit, and a detection transistor. The current limiter is a transistor mounted as a diode. The charging circuit uses the supply voltage to charge the capacitor through the current limiter. The relatively stable voltage of the capacitor is applied to the gate of the detection transistor, which has a threshold voltage Vtp. The source of the detection transistor is connected to the voltage supply Vcc. If Vcc varies suddenly, the detector is made conductive. The assembly uses the difference between the threshold voltage Vtn of the current limiter and the threshold voltage Vtp of the detection transistor.

24 Claims, 2 Drawing Sheets

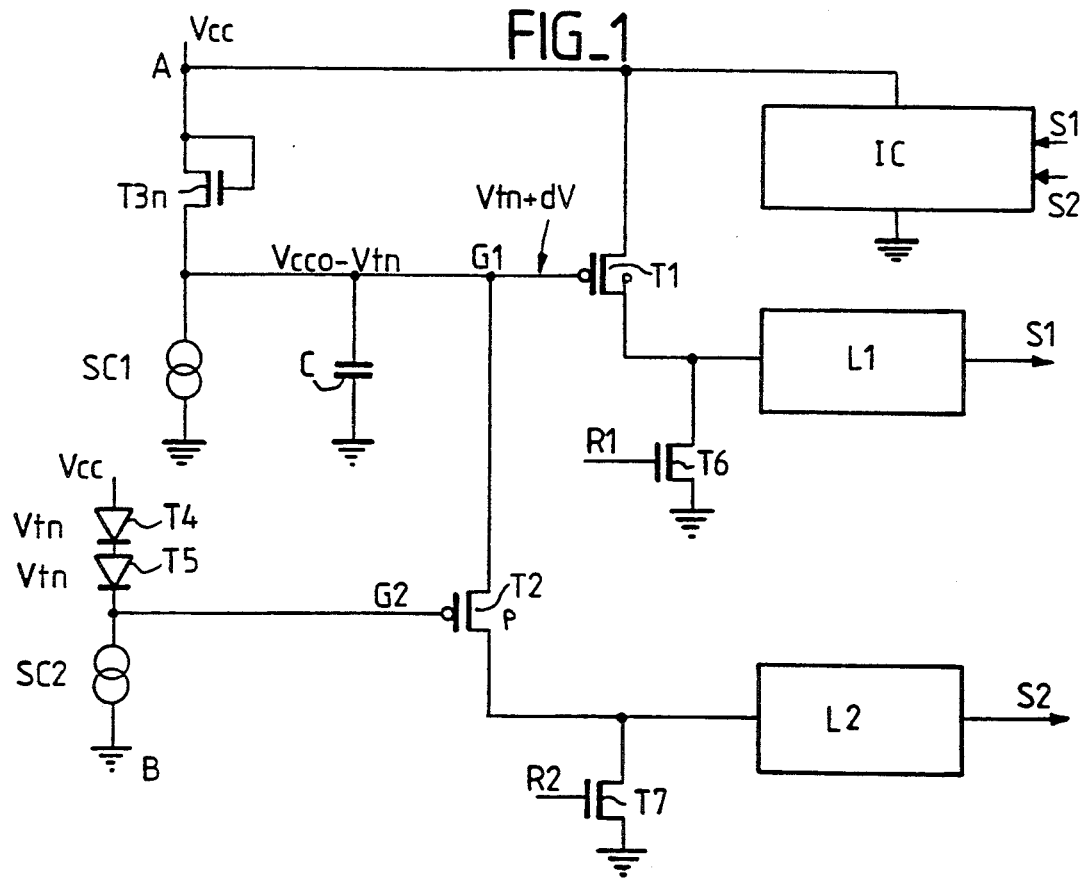
FIG_1
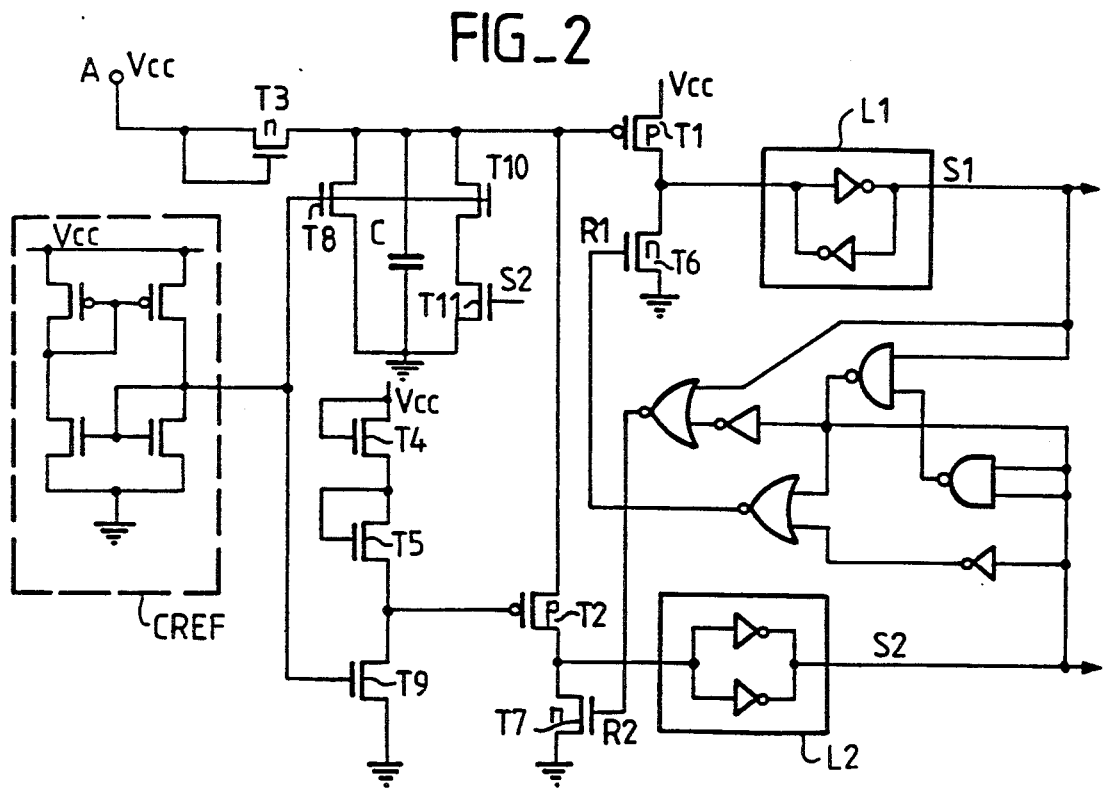
FIG_2

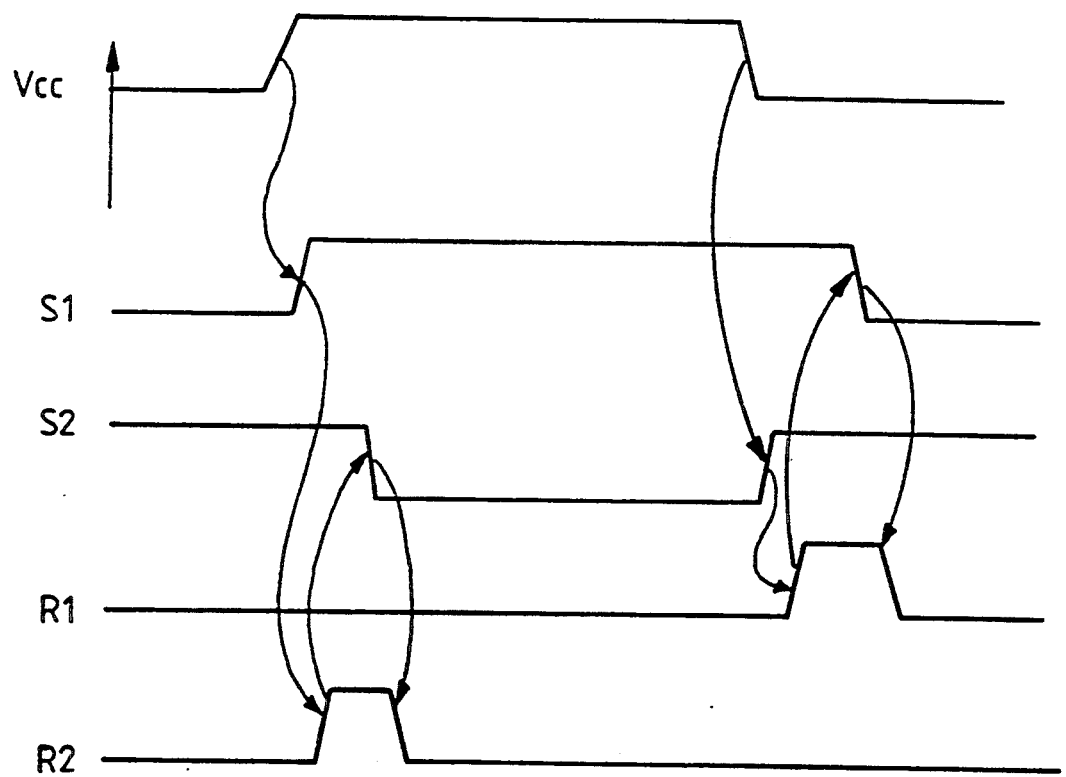
FIG_3

DETECTOR OF FAST VARIATION IN THE SUPPLY OF INTEGRATED CIRCUITS

BACKGROUND OF THE INVENTION

1. Field of the Invention

The invention concerns integrated circuits and, more precisely, a detector of variations in the supply voltage Vcc of an integrated circuit, this detector forming part of the integrated circuit itself.

2. Description of the Prior Art

In certain applications, and especially in applications requiring confidentiality or safety of storage of the pieces of information memorized in the integrated circuit or processed in this circuit, it has been realized that it is possible to obtain access by fraudulent means to this confidential information and, as the case may be, to modify it by acting on the supply voltage Vcc of the circuit. It is possible, for example, to conceive of a situation where the confidentiality protection circuits no longer work accurately beyond a certain value of supply voltage.

Applications of this type are increasingly numerous and are illustrated notably by the integrated circuits mounted in chip cards, chip keys etc. These circuits are frequently associated with applications where confidentiality and security are sought.

Some of these circuits have been provided with detectors of any abnormal rise in the voltage Vcc above its nominal value or above the range of nominal values permitted in normal functioning. When the detector sees that the voltage Vcc has exceeded the nominal value (generally 5 volts) by 20% for example, it sends a signal barring all or a part of the functioning of the integrated circuit.

The detectors used for this purpose are threshold detectors, the threshold of which is chosen as a function of the acceptable limit for Vcc. They generally carry out their function accurately.

However, it has been realized, according to the present invention, that there are cases where the function is no longer fulfilled properly: the detector does not react in the requisite way to the variations in supply voltage.

SUMMARY OF THE INVENTION

The invention places a detector of fast variations in the supply voltage in the integrated circuit. This detector is placed either instead of a threshold detector used to detect an excessively high supply voltage or in addition to this threshold detector. This fast variations detector is used to modify to bar the operation of all or a part of the other components of the integrated circuit when the supply voltage of the integrated circuit undergoes fast high-amplitude variations.

Indeed, the invention lies firstly in the observation that the security system may no longer work properly when the voltage applied by a fraudulent individual is not a voltage that clearly exceeds the supply voltage but is a fast variation of this voltage, namely a variation that a standard threshold detector does not have the time to detect.

The invention proposes an embodiment of a detector of fast variations in voltage, making it possible to improve security with respect to existing systems.

The detector of supply voltage variations according to the invention includes chiefly a capacitor, a means for charging this capacitor by the supply voltage with a limiter of current for charging or discharging this capacitor, and a means to apply the difference between the supply voltage and the voltage at the terminals of the capacitor to a detection transistor.

The effect of the current limiter is that the capacitor does not immediately follow fully the variations in supply voltage. The result thereof is a shift voltage which is applied to the detection transistor to modify its conduction. In practice, the detection transistor will be made conductive if it is non-conductive, or it will be made non-conductive if it is conductive.

This detection circuit makes it possible to detect fast variations in the supply voltage (but not very slow variations) if these variations are big enough. There is not really any absolute amplitude threshold for which the detector reacts. Indeed, a detection signal is produced as a function of the amplitude of the variation in the supply voltage taking into account the speed in variation. It is possible to define a threshold of amplitude of variation making the detector react when the variation is much faster than the capacitor charging time constant. This threshold could be, for example, about 10% to 20% of the value of the supply voltage.

To detect fast variations alternating upwardly and downwardly, the detection circuit may be duplicated with two capacitors and two detector transistors, one of which detects a shift voltage during the charging of its associated capacitor while the other detects a shift voltage due to the discharging of its associated capacitor, the charging resulting from the increase in the supply voltage and the discharging resulting from its reduction.

However, to make a saving of one capacitor, preferably the invention will use only one capacitor, a first detection transistor having its source connected to the supply voltage and its gate connected to its associated capacitor, and a second detection transistor having its source connected to the same capacitor and its gate connected to a voltage which varies directly with the supply voltage.

In one embodiment, the capacitor charge current limiter is a third transistor mounted as a diode, connected between the supply voltage Vcc and the gate of the first transistor, and setting up a threshold voltage between its source and its drain. The second transistor then preferably has its gate connected to the supply voltage Vcc by a fourth transistor and a fifth transistor of the same type as the third one, the fourth and fifth transistors being series-connected and mounted as diodes. It is seen that a threshold voltage is set up at the terminals of the series-connected assembly, this threshold voltage being substantially twice the threshold voltage of the third transistor. The gate potential of the second transistor in permanent mode is then equal to the supply voltage Vcc reduced by this double threshold voltage. Simultaneously, the gate potential of the first transistor is equal to the supply voltage Vcc reduced by the threshold voltage of the third transistor.

The first and second transistors are preferably both of a type opposite to the third one. The detector circuit then works as a consequence of the difference between the threshold voltage of the limiter transistor (which is lower) and the threshold voltage of the detection transistors (which is higher).

Besides, there is preferably provision for a capacitor discharging current source if the limiter is mounted so that it lets through a current for charging the capacitor in only one direction (whether it is a charging or a discharging operation).

There is provision also for a source of biasing current for the fourth and fifth transistors.

To exploit the changes in conduction of the first and second transistors, it is preferably provided that the turning on of the first detection transistor will serve to trigger a first flip-flop circuit and restore the state of a second flip-flop circuit and that, reciprocally, the turning on of the second detection transistor will trigger the second flip-flop circuit and restore the state of the first flip-flop circuit. Using the output signals of the two flip-flop circuits, it is possible to control the integrated circuit as desired, notably to prevent its operation entirely or partially.

BRIEF DESCRIPTION OF THE DRAWINGS

Other characteristic features and advantages of the invention will appear from the following detailed description, made with reference to the appended drawings, of which:

FIG. 1 is a diagram of a simple embodiment of the invention;

FIG. 2 is a diagram of a more complex embodiment; and

FIG. 3 shows a timing diagram of signals in the circuit of FIG. 2.

DESCRIPTION OF PREFERRED EMBODIMENTS

The detector circuit according to the invention, shown in FIG. 1, is designed to be utilized with a more general integrated circuit IC to form an overall integrated circuit. The overall integrated circuit is supplied with a supply voltage Vcc between two terminals A and B. The terminal B is a voltage supply ground and the terminal A is a terminal at the potential Vcc. The purpose of the detector circuit is the detection of fast variations in the supply voltage Vcc, to modify or interrupt all or a part of the working of the general circuit IC when the voltage Vcc undergoes fast variations of sufficient amplitude.

The detector circuit includes a capacitor C capable of being charged by the voltage Vcc through a current limiter. Herein, the current limiter is a transistor T3 mounted as a diode, i.e with its gate connected to its drain. The drain of transistor T3 is connected to Vcc (terminal A0, and the source of transistor T3 is connected to a first terminal of the capacitor C, the second terminal of the capacitor C being at the ground (terminal B). With this assembly, the transistor T3 is an N channel transistor for a positive voltage Vcc. The transistor T3 sets up a voltage drop Vt between its terminals where Vtn is the threshold voltage of this transistor. Vtn depends on the technology used.

The detector circuit would work also if the capacitor charging voltage were to be a fraction of the general supply voltage Vcc of the integrated circuit rather than the supply voltage itself.

A current source SC1 is connected in parallel with the capacitor C. It enables the discharging of the capacitor C when the voltage Vcc falls below a certain value (the capacitor C cannot be discharged through the transistor T3 mounted as a diode).

In stable Vcc supply mode, the capacitor C remains permanently charged at a voltage which is substantially Vcco-Vtn, where Vcco is the stable value of Vcc and Vtn is the threshold voltage of the transistor T3. The difference in potential between the terminal A (at Vcco) and the voltage of the capacitor is equal to Vtn, namely to the drop in voltage introduced by the limiter.

When Vcc varies swiftly in the rising direction, the capacitor C tends to keep the voltage Vcco-Vtn at its terminals, owing to the presence of the current limiter and of the resistances of other components in the detector circuit which prevent an instantaneous charging of the capacitor C. The delay between the variation in Vcc and the variation in potential at the terminals of the capacitor C results in an additional difference in potential between the terminal A (at Vcc) and the voltage of the capacitor (Vcco-Vtn).

If Vcc=Vcco+dV, i.e. if Vcc has suddenly varied by the positive value of dV, the difference in voltage between terminal A and the capacitor C is now Vtn+dV provided, however, that the variation in Vcc is very fast as compared with the capacitor recharging time. If the variation is slower than the capacitor recharging time, it will be understood that dV will represent, more precisely, a fraction of the variation in the supply voltage Vcc.

This variation in voltage from Vtn to Vtn+dV is used to turn on a detection transistor T1 which was previously off.

The detection transistor T1 is a P channel transistor, having its gate connected to capacitor C (point G1) and its source connected to Vcc (terminal A). The transistor T1 has a threshold voltage Vtp such that the transistor T1 is off when Vcc remains stable, i.e. when the voltage Vtn is present between the terminal A (source of transistor (T1) and the point G1 (gate of transistor T1) and is, on the contrary, conductive when a voltage dV is added to Vtn between the gate and source of transistor T1. Consequently, in this embodiment, the technology should be such that the threshold voltage Vtp of the P channel transistor T1 is higher than the threshold voltage Vtn of the transistor T3 and lower than Vtn+dV.

If necessary, the transistor T3 may be depleted to have a threshold voltage that is reduced with respect to the other N channel transistors of the integrated circuit.

The transistor T1 will come on if the difference in voltage dV produced by the sudden rise in Vcc is such that Vtn+dV becomes higher than Vtp while Vtn is lower than Vtp. The variation of Vcc should therefore be fast enough for the terminals of the capacitor C to have insufficient time to follow the variation of Vcc and for a sufficient shift voltage dV to be produced.

The assembly therefore uses the fact that there is a difference between the threshold voltages of the transistors T1 and T3 (threshold voltages taken in terms of absolute value).

The turning on of the transistor T1 is used to trigger a flip-flop circuit L1 which gives a signal S1, at its output, indicating a sudden rise in Vcc. An auxiliary transistor T6 makes it possible to restore the flip-flop circuit L1 to its initial state under the control of a restoring signal R1. The signal S1 can be used to interrupt or modify the working of all or a part of the general integrated circuit IC.

It will be understood that the capacitor C necessarily has a limited value and, consequently, if the variation in Vcc is too slow, the voltage at the terminals of the capacitor will follow the variations of Vcc and will not trigger the turning-on of the detection transistor T1.

It is preferred to contrive a circuit-based solution rather than to use another capacitor and a symmetrical assembly to detect also a fast drop in the voltage Vcc.

A second detection transistor T2, of a P channel type like T1 and having the same threshold voltage Vtp, has its source connected to the point G1, namely to the capacitor C, and it has its gate connected to a point G2 with a potential Vcc-2Vtn. This is obtained by the connection, between the terminal A (at Vcc whatever may be the value of Vcc) and the point G2, of two transistors T4 and T5 of the same type and the same threshold voltage as transistor T3, mounted as diodes and each setting up a threshold voltage Vtn between their source and their drain. Each of the transistors T4 and T5 is mounted with its gate connected to its drain. They are series-mounted between the terminal A and the point G2 to set up a voltage drop 2Vtn between the two points. A current source SC2 between the point G2 and the ground provides for the flow of a permanent current in the transistors T4 and T5 to maintain this voltage drop of 2Vtn. The transistors T4 and T5 could be replaced by another assembly setting up a threshold voltage of 2Vtn or approximately so. For example a single transistor mounted as an undepleted diode, could be suitable if its threshold voltage is on the order of twice that of the transistor T3.

The potential of G2 is therefore Vcc-2Vtn irrespectively of Vcc.

In permanent mode (Vcc stable and equal to value Vcco for example), the source potential of the second detection transistor T2 is Vcco-Vtn (voltage at the terminals of the capacitor C); the gate potential of transistor T2 is Vcco-2Vtn. There is therefore Vtn between gate and source of transistor T2. The second detection transistor T2 is therefore off, the voltage Vtn between its gate and source being lower than its threshold voltage Vtp.

When Vcc varies swiftly in the downward direction, the voltage of the capacitor C does not follow instantaneously and remains temporarily at Vcco-Vtn. The shift dV resulting from the fast variation of Vcc and from the relative stability of the source voltage of transistor T2 is expressed by the appearance of a voltage Vtn+dV between the gate and source of the second detection transistor T2. This second detection transistor T2 becomes conductive as soon as the shift dV goes beyond a threshold and, more precisely, as soon as Vtn+dV goes beyond the threshold voltage Vtp of this transistor T2.

The turning on of the second detection transistor T2 triggers the tripping of a second flip-flop circuit L2 which gives, at its output, a signal S2 indicating a swift downward variation of the supply voltage Vcc. The signals S2 coming from the flip-flop circuit L2 are used like the signals S1 or in combination with the signals S1 (as the case may be) to trigger a modification of operation or an interruption of all or a part of the general integrated circuit IC. A transistor T7 controlled by restoring signal R2, enables the flip-flop circuit L2 to be restored to its initial when this is desired.

As can be seen the detector circuit symmetrically detects a swift rise or a swift drop in the voltage Vcc. The operation relies on the difference between the threshold voltage Vtn of the current limiter transistor T3 and the threshold voltage Vtp of the detection transistors T1 and T2.

It can be easily ascertained that, when the voltage Vcc drops, transistor T1 does not get turned on while, when the voltage Vcc rises, transistor T2 does not get turned on. The current source SC1 enables, the capacitor C to get discharged when the voltage across the capacitor C drops.

FIG. 2 shows a more detailed embodiment. The already described elements, bearing the same references as FIG. 1, will not be described again.

The current sources in FIG. 2 are transistors having their base controlled by a common reference circuit CREF. This circuit is a standard double current mirror giving a bias voltage Vpol which is applied to the bases of the different transistors used as a current source.

In particular, the current source SC1 is a transistor T8, thus controlled by Vpol. The current source SC2 is a transistor T9 controlled by Vpol.

Another current source (transistor T10 controlled by Vpol) is placed in series with a switch-over transistor T11, this entire assembly being in parallel with the capacitor C. The transistor T11 is made conductive by the signal S2, triggered during a fast drop in Vcc. It enables the two current sources to be parallel-mounted during a fast drop in Vcc to accelerate the discharging of the capacitor.

Finally, FIG. 2 shows a logic circuit with two NAND gates, two NOR gates and two inverters, receiving the signals S1 and S2 and preparing the restoring signals R1 and R2 of the flip-flop circuit L1 and the flip-flop circuit L2 respectively.

FIG. 3 gives the explanation of this logic circuit in the form of a timing diagram of signals, with cause-and-effect relationships (curved arrows) between the different signals.

A fast rise in Vcc triggers the tripping of signal S1 which then triggers the restoration signal R2. The signal S2 is zero-set by restoration signal R2 and then itself triggers the zero-setting of restoration R2. A fast drop in Vcc triggers the signal S2 which triggers the restoration signal R1. The signal S1 is then zero-set and, after this it triggers the zero-setting of restoration signal R1.

What is claimed is:

1. An integrated circuit having a supply voltage terminal for a supply voltage Vcc, a ground terminal, and a detector of fast variations in said supply voltage Vcc at said supply voltage terminal, said detector comprising:

a capacitor having first and second terminals, with said first terminal of said capacitor being connected to said ground terminal;

a first detection transistor having a gate, a source and a drain; said source of said first detection transistor being connected to said supply voltage terminal, said drain of said first detection transistor being connected to an output terminal, and said gate of said first detection transistor being connected to said second terminal of said capacitor; and a current limiting transistor having its gate connected to its drain, said current limiting transistor having a threshold voltage that is lower, in terms of absolute value, than the threshold voltage of said first detection transistor, said current limiting transistor being connected between said second terminal of said capacitor and said supply voltage terminal such that upon becoming conductive said current limiting transistor provides charging current to said capacitor to charge said capacitor to a voltage which is substantially Vcco-Vtn, where Vcco is a stable value of the supply voltage Vcc and Vtn is the threshold voltage of the current limiting transistor, thereby maintaining in a stable voltage supply mode a voltage drop between said supply voltage terminal and the gate of said first detection transistor which is the difference between the supply voltage and the voltage at the second terminal of said capacitor;

whereby, when the supply voltage Vcc varies swiftly from the stable voltage supply mode as compared with the charging time of said capacitor, the voltage drop between said supply voltage terminal and the gate of said first detection transistor increases and the conduction state of said first detection transistor changes when the thus increased voltage drop exceeds the threshold voltage of said first detection transistor;

whereby said detector can detect a fast variation in said supply voltage Vcc when the speed of the fast variation is faster than the charging rate of said capacitor.

2. An integrated circuit according to claim 1 further comprising a second detection transistor having its source connected to said second terminal of said capacitor and its gate connected to a voltage that varies directly with the supply voltage.

3. An integrated circuit according to claim 2 wherein said second detection transistor has the same type of conductivity as said first detection transistor, and wherein the threshold voltage of said second detection transistor is the same as that of said first detection transistor.

4. An integrated circuit according to claim 3 wherein said voltage that varies directly with the supply voltage Vcc is provided by fourth and fifth transistors, each of said fourth and fifth transistors having the same type of conductivity and the same threshold voltage as said current limiting transistor, said fourth and fifth transistors being connected as diodes in series between said supply voltage terminal and the gate of said second detection transistor to set up a voltage Vcc-2Vtn at the gate of said second detection transistor, where Vtn is the threshold voltage of each of said fourth and fifth transistors.

5. An integrated circuit according to claim 4, wherein said current limiting transistor lets the charge current through only in the direction towards the capacitor; and wherein said detector further comprises a discharging circuit for discharging said capacitor.

6. An integrated circuit according to claim 5, further comprising first and second flip-flop circuits, with the drain of said first detection transistor being connected to an input of said first flip-flop circuit and the drain of said second detection transistor being connected to an input of said second flip-flop circuit, so that the turning on of said first detection transistor triggers said first flip-flop circuit and restores the state of said second flip-flop circuit and so that the turning on of said second detection transistor triggers said second flip-flop circuit and restores the state of said first flip-flop circuit.

7. An integrated circuit according to claim 6 further comprising a general circuit, wherein the outputs of said first and second flip-flop circuits are connected to said general circuit to modify the operation of said general circuit responsive to the outputs of said first and second flip-flop circuits.

8. An integrated circuit according to claim 1, wherein said current limiting transistor lets the charge current through only in the direction towards the capacitor; and wherein said detector further comprises a capacitor discharging current source connected between said second terminal of said capacitor and said ground terminal for discharging said capacitor.

9. An integrated circuit according to claim 1, further comprising a flip-flop circuit, the drain of said first detection transistor being connected to an input of said flip-flop circuit, so that the turning on of said first detection transistor triggers said flip-flop circuit.

10. An integrated circuit according to claim 9 further comprising a general circuit, and wherein the output of said flip-flop circuit is connected to said general circuit to modify the operation of said general circuit responsive to the output of said flip-flop circuit.

11. An integrated circuit according to claim 10, wherein said current limiting transistor lets the charge current through only in the direction towards the capacitor; and wherein said detector further comprises a discharging circuit for discharging said capacitor.

12. An integrated circuit according to claim 1 further comprising a general circuit, and wherein the operation of said general circuit is modifiable in response to the output of said first detection transistor.

13. An integrated circuit according to claim 1 further comprising a second detection transistor having its source connected to said second terminal of said capacitor and its gate connected to a voltage that varies directly with the supply voltage Vcc; wherein said second detection transistor has the same type of conductivity as said first detection transistor; wherein the threshold voltage of said second detection transistor is the same as that of said first detection transistor; wherein said current limiting transistor lets the charge current though only in the direction towards the capacitor; and wherein said detector further comprises a discharging circuit for discharging said capacitor.

14. An integrated circuit according to claim 1 further comprising a second detection transistor and first and second flip-flop circuits; said first detection transistor having its source connected to said second terminal of said capacitor and its gate connected to a voltage that varies directly with the supply voltage Vcc; said second detection transistor having the same type of conductivity as said first detection transistor; the threshold voltage of said second detection transistor being the same as that of said first detection transistor; the drain of said first detection transistor being connected to an input of said first flip-flop circuit and the drain of said second detection transistor being connected to an input of said second flip-flop circuit, so that the turning on of said first detection transistor triggers said first flip-flop circuit and restores the state of said second flip-flop circuit and so that the turning on of said second detection transistor triggers said second flip-flop circuit and restores the state of said first flip-flop circuit.

15. An integrated circuit according to claim 1 further comprising a second detection transistor having its source connected to said second terminal of said capacitor and its gate connected to a voltage that varies directly with the supply voltage Vcc, wherein said second detection transistor has the same type of conductivity as said first detection transistor, wherein the threshold voltage of said second detection transistor is the same as that of said first detection transistor; and a general circuit, wherein the operation of said general circuit is modifiable responsive to the outputs of said first and second detection transistors.

16. An integrated circuit according to claim 1 further comprising a second detection transistor having its source connected to said second terminal of said capacitor, fourth and fifth transistors, said fourth transistor having the same type of conductivity and the same threshold voltage as said fifth transistor, said fourth and fifth transistors being connected as diodes in series between said supply voltage terminal and the gate of said second detection transistor to set up a voltage Vcc-2Vtn at the gate of said second detection transistor, where Vtn is the threshold voltage of each of said fourth and fifth transistors.

17. An integrated circuit according to claim 16 further comprising a general circuit, wherein the operation of said general circuit is modifiable responsive to the outputs of said first and second detection transistors.

18. An integrated circuit according to claim 1 further comprising a second detection transistor having its source connected to said second terminal of said capacitor and its gate connected to a voltage that varies directly with the supply voltage; wherein said current limiting transistor lets the charge current through only in the direction towards the capacitor; and wherein said detector further comprises a discharging circuit for discharging said capacitor.

19. An integrated circuit according to claim 1, further comprising a second detection transistor having its source connected to said second terminal of said capacitor and its gate connected to a voltage that varies directly with the supply voltage Vcc, first and second flip-flop circuits, the drain of said first detection transistor being connected to an input of said first flip-flop circuit and the drain of said second detection transistor being connected to an input of said second flip-flop circuit, so that the turning on of said first detection transistor triggers said first flip-flop circuit and restores the state of said second flip-flop circuit and so that the turning on of said second detection transistor triggers said second flip-flop circuit and restores the state of said first flip-flop circuit.

20. An integrated circuit according to claim 19 further comprising a general circuit, and a modification circuit to modify the operation of components of said general circuit responsive to the outputs of said first and second flip-flop circuits.

21. An integrated circuit according to claim 1 wherein said current limiting transistor has a type of conductivity which is opposite to that of said first detection transistor, wherein said source of said first detector transistor and the drain of said current limiting transistor are connected to said supply voltage terminal.

22. A process for detecting fast variations in the supply voltage at a supply voltage terminal of an integrated circuit even when the thus varied supply voltage does not exceed the range of nominal values of said supply voltage, said process comprising:

applying said supply voltage to a current limiting transistor and a first detection transistor, wherein said current limiting transistor has a threshold voltage that is lower, in terms of absolute value, than the threshold voltage of said first detection transistor;

providing a current flow through said current limiting transistor to a first terminal of a capacitor upon said supply voltage exceeding the threshold voltage of aid current limiting transistor to charge said capacitor to a voltage which is substantially Vcco-Vtn, where Vcco is the stable value of the supply voltage and Vtn is the threshold voltage of the current limiting transistor;

applying the voltage at said first terminal of said capacitor to the gate of said first detection transistor;

maintaining, in a stable voltage supply mode, the capacitor charged with a voltage at said first terminal of said capacitor which is substantially Vcco-Vtn, where Vcco is the stable value of the supply voltage and Vtn is the threshold voltage of the current limiting transistor, thereby maintaining at the gate of said first detection transistor a voltage which is the difference between the supply voltage and the voltage at the first terminal of said capacitor;

whereby, when the supply voltage varies swiftly from the stable voltage supply mode as compared with the charging time of said capacitor, the voltage drop between said supply voltage terminal and the gate of said first detection transistor increases and the conduction state of said first detection transistor changes when the thus increased voltage drop exceeds the threshold voltage of said first detection transistor; and modifying the operation of a portion of the integrated circuit when said first detection transistor changes state after a stable voltage supply mode has been achieved.

23. A process in accordance with claim 22 wherein the step of modifying the operation comprises barring at least a part of the functioning of the integrated circuit.

24. A process in accordance with claim 22 further comprising applying said supply voltage across a serially connected combination of two transistors and a permanent current source, with the gate of a second detection transistor being connected to the junction between the permanent current source and the two serially connected transistors, and the current path of said second detection transistor being connected to said first terminal of said capacitor.

* * * * *

UNITED STATES PATENT AND TRADEMARK OFFICE
CERTIFICATE OF CORRECTION

PATENT NO. : 5,144,515
DATED : Sep. 1, 1992
INVENTOR(S) : Serge Fruhauf, Frederic Breugnot It is certified that error appears in the above-identified patent and that said Letters Patent is hereby corrected as shown below:

On the title page, Item [75] Inventors

In the second inventor's name, replace "Fre eric"

with --Frederic--.

In the assignee's address, replace "Gendelly"

with --Gentilly--.

Signed and Sealed this

Twenty-sixth Day of October, 1993

Attest:

BRUCE LEHMAN

*Attesting Officer*  *Commissioner of Patents and Trademarks*